United States Patent
Cho

(10) Patent No.: US 6,953,747 B2
(45) Date of Patent: Oct. 11, 2005

(54) METHOD FOR FORMING GATE OXIDE IN SEMICONDUCTOR DEVICE

(75) Inventor: Byoung Hee Cho, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 13 days.

(21) Appl. No.: 10/739,229

(22) Filed: Dec. 18, 2003

(65) Prior Publication Data

US 2004/0132261 A1 Jul. 8, 2004

(30) Foreign Application Priority Data

Jan. 7, 2003 (KR) .................................. 10-2003-0000713

(51) Int. Cl.$^7$ .............................................. H01L 21/44
(52) U.S. Cl. ........................ 438/663; 438/659; 438/775
(58) Field of Search ................................ 438/663, 643, 438/653, 659, 590, 591, 770, 775, 769

(56) References Cited

U.S. PATENT DOCUMENTS

| | | | | |
|---|---|---|---|---|
| 5,851,893 A | * | 12/1998 | Gardner et al. | ............. 438/305 |
| 6,242,348 B1 | * | 6/2001 | Kamal et al. | ............... 438/682 |
| 6,287,897 B1 | * | 9/2001 | Gousev et al. | .............. 438/142 |
| 6,450,116 B1 | * | 9/2002 | Noble et al. | ............ 117/723 R |
| 6,541,395 B1 | * | 4/2003 | Trivedi et al. | .............. 438/775 |
| 6,562,730 B2 | * | 5/2003 | Jeng | ........................... 438/775 |

* cited by examiner

*Primary Examiner*—David Nhu
(74) *Attorney, Agent, or Firm*—Marshall, Gerstein & Borun LLP

(57) ABSTRACT

The present invention provides a method for forming a gate oxide film of a semiconductor device including the steps of; forming a gate oxide film and a polysilicon film sequentially on a semiconductor substrate; performing a nitrogen ion implantation process after the formation of the gate oxide film and the polysilicon film; performing a thermal treatment process to form barrier layers by combination of oxides and nitrogen at an interface between the semiconductor substrate and the gate oxide film, and at an interface between the gate oxide film and the polysilicon film; and forming a nitride on the polysilicon film.

4 Claims, 3 Drawing Sheets

METHOD FOR FORMING GATE OXIDE IN SEMICONDUCTOR DEVICE

BACKGROUND

1. Field of the Invention

The present invention relates to a method for forming a gate oxide film of a semiconductor device, and more specifically, a method for forming a gate oxide film of a semiconductor device capable of reducing amounts of electrons and holes, which are trapped in the oxide film.

2. Discussion of Related Art

An electrically erasable programmable flash memory cell demands a high voltage at the time of programming or erasing operation. Repetition of the programming and erasing operations with the high voltage results in occurrence of traps of electrons and holes in the gate oxide film of the flash memory cell. In turn, the electrons and holes trapped in the gate oxide film shift the gate voltage, which is applied to the gate of the cell. For example, if the programming and erasing operations are repeated by 10,000 to 1,000,000 times, the accumulation of the trapped charges shift the threshold voltage of the cell.

The trap of charges in the oxide film can be reduced by using a nitride oxide film. Namely, the occurrence of the trap of the charges can be suppressed by forming a barrier layer, which is made by combination of an oxide and nitrogen in the direction of the silicon substrate by means of $N_2O$ or $N_2$ treatment at the time of growing the oxide film.

However, in case of the flash cell, the current flow occurs at both ends of the gate. Therefore, although the trap of charges in the direction of the silicon is suppressed by the barrier formed by the oxide and the nitrogen, the trap of charges in the direction of the polysilicon cannot be suppressed since there is no barrier formed by the oxide and nitrogen. Namely, the trap of charges in the direction of the substrate is suppressed, but the trap of charges in the direction of the polysilicon is not suppressed.

Now, a conventional method of forming a gate oxide film will be described with reference to FIGS. 1A to 1C.

As shown in FIG. 1A, a well formation process and an ion implantation process for controlling a threshold voltage of a cell are carried out on the semiconductor substrate 10. Next, a gate oxide film 20 is formed by using an oxidation process, and then, a polysilicon film 30 is formed above the gate oxide film 20.

Referring to FIG. 1B, a nitride film 40 is formed above the polysilicon film 30.

FIG. 1C is a cross-sectional view illustrating a state that the gate oxide 20 and a device isolation film are formed by performing a patterning process, a self-aligned contact oxidation process, a High Density Plasma (HDP) oxide film burying process, and a nitride film removing process for forming a device isolation film.

As described above, in case of the conventional method, the current flow occurs at both ends of the gate. Therefore, although the trap of charges in the direction of the silicon is suppressed by the barrier formed by the oxide and the nitrogen, the trap of charges in the direction of the polysilicon cannot be suppressed since there is no barrier formed by the oxide and nitrogen. Namely, the trap of charges in the direction of the substrate is suppressed, but the trap of charges in the direction of the polysilicon is not suppressed.

SUMMARY OF THE INVENTION

The present invention is directed to a method of gate oxide film of a semiconductor device capable of suppressing a trap of charges in a direction of a polysilicon as well as suppressing a trap of charges in a direction of a semiconductor substrate.

One aspect of the present invention is to provide a method for forming a gate oxide film of a semiconductor device comprising the steps of; forming a gate oxide film and a polysilicon film sequentially on a semiconductor substrate; performing a nitrogen ion implantation process for the semiconductor substrate including the gate oxide film and the polysilicon film; performing a thermal treatment process to form barrier layers by combination of oxides and nitrogen at an interface between the semiconductor substrate and the gate oxide film, and at an interface between the gate oxide film and the polysilicon film; and forming a nitride film on the polysilicon film.

In the aforementioned of a method for forming a gate oxide film of a semiconductor according to another embodiment of the present invention, the thermal treatment process is performed by an RTP spark annealing process.

In the aforementioned of a method for forming a gate oxide film of a semiconductor according to another embodiment of the present invention, the nitrogen ion implantation process is performed by using a source gas including $N^+$ or $N_2^+$, with a dose of $1E14$ atoms/cm$^2$ to $1E16$ atoms/cm$^2$ and an implantation energy of 1 keV to 20 keV.

In the aforementioned of a method for forming a gate oxide film of a semiconductor according to another embodiment of the present invention, the RTP spark annealing process is performed at an $N_2$ gas ambient, a ramp up temperature is about 100° C./sec, and the RTP temperature is 900° C. to 1100° C.

DETAILED DESCRIPTION OF PREFERRED EMBODIMENTS

Now the preferred embodiments according to the present invention will be described in detail with reference to the accompanying drawings.

FIGS. 2A to 2D are cross-sectional views for explaining a method for forming a gate oxide of a semiconductor device in accordance with the present invention.

Figure 1A:
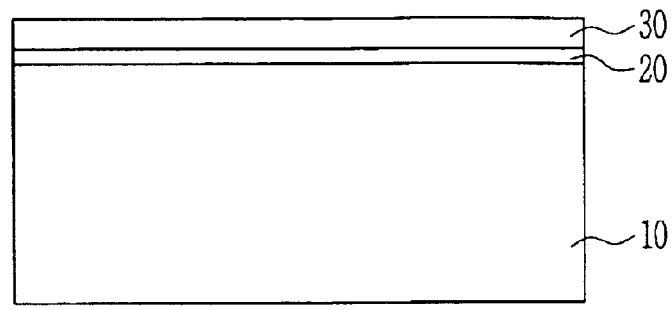
FIGS. 1A to 1C are cross-sectional views for explaining a method of forming a gate oxide of a semiconductor device in accordance with a conventional method.
Figure 1B:
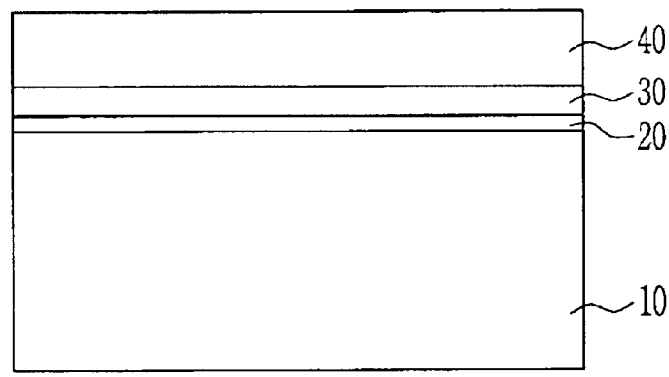
Figure 1C:
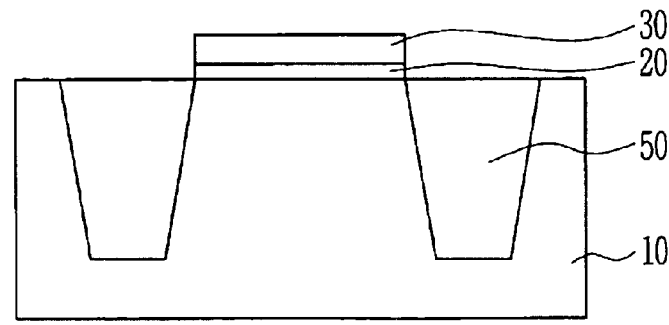
Figure 2A:
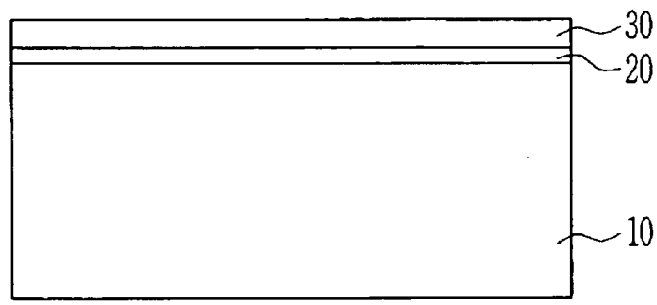
FIGS. 2A to 2D are cross-sectional views for explaining a method of forming a gate oxide of a semiconductor device in accordance with the present invention.

As shown in FIG. 2A, a well formation process and an ion implantation process for controlling a threshold voltage of a cell are carried out on the semiconductor substrate 10. Next, a gate oxide film 20 is formed by using an oxidation process, and then, a polysilicon film 30 is formed above the gate oxide film 20.

Figure 2B:
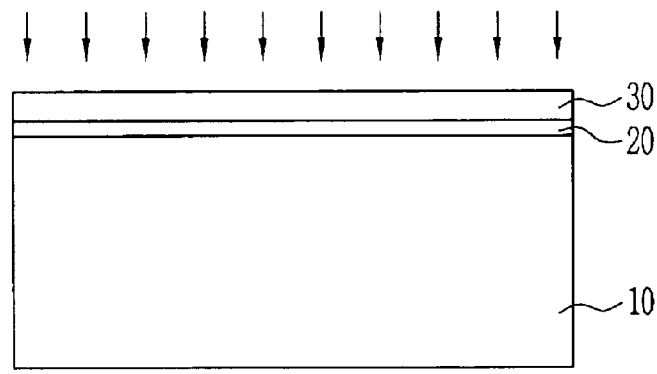

FIG. 2B is a cross-sectional view illustrating a state that a nitrogen ion implantation process is carried out to implant the nitrogen ion at the interface of the polysilicon film 30 and the gate oxide film 20, and then, an rapid thermal processing (RTP) is performed at an $N_2$ gas ambient. By the thermal treatment process, the nitrogen and the oxide at are reacted at an interface between the semiconductor substrate 10 and the gate oxide film 20, and at the interface between the polysilicon film 30 and the gate oxide film 20 to form barrier layer. By doing so, the trap of charges in the direction of the semiconductor substrate as well as the trap of charges in the direction of the polysilicon is suppressed. The nitrogen ion implantation process is performed by using a source gas including $N^+$ or $N_2^+$, with a dose of 1E14 atoms/cm$^2$ to 1E16 atoms/cm$^2$ and an implantation energy of 1 keV to 20 keV. The thermal treatment process is carried out by using an RTP spark annealing process. The RTP spark annealing process is performed at an $N_2$ gas ambient, a ramp up temperature is about 100° C./sec, and the RTP temperature is 900° C. to 1100° C.

The barrier layers formed in both directions function as barriers against the traps of the electrons and the holes, which occur in the both directions at the time of the programming and erasing operations on the flash cell, so that it is possible to effectively avoid the shift of the gate voltage applied to the gate of the cell.

Figure 2C:
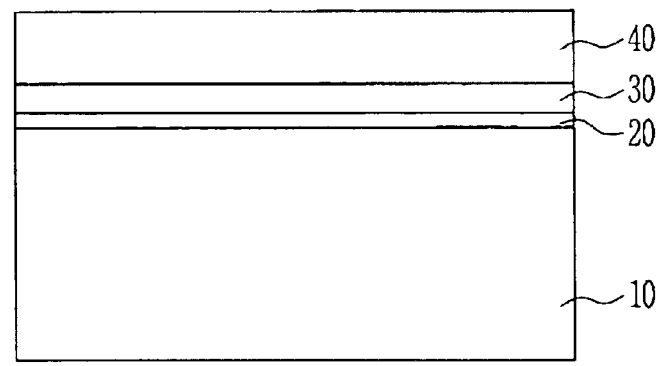
Figure 2D:
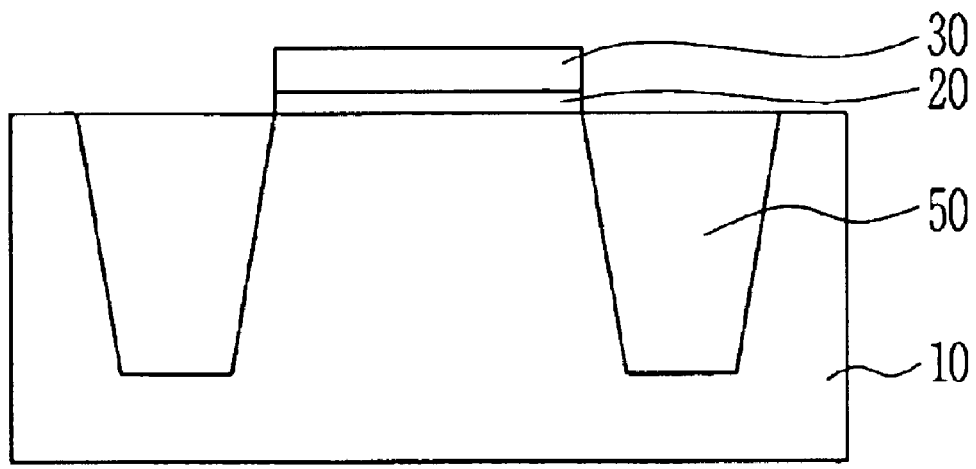

Referring to FIG. 2C, a nitride film 40 is formed above the polysilicon film 30.

FIG. 4D is a cross-sectional view illustrating a state that the gate oxide 20 and a device isolation film 50 are formed by performing a patterning process, a self-aligned contact oxidation process, an HDP oxide film burying process, and a nitride film 40 removing process for forming a device isolation film.

As described above, according to the present invention, it is possible to reduce the amount of the trapped charges which occur due to the current flow in the gate oxide at the time of the programming and erasing operations of a NAND flash memory cell by using the barrier layers formed in both directions due to reaction of the oxide and the nitrogen, thereby being capable of suppressing the shift of the threshold voltage.

The avoidance of the shift of the threshold voltage of the cell by using the barrier layers in both directions results in the preservation of uniform characteristics of the cell at the repetition of the programming and erasing operations, so that it is possible to improve the characteristics associated with the programming and erasing operations.

In addition, in case of an NAND flash memory, an oxidation-enhanced diffusion (OED) effect is generated due to a thermal treatment process which is carried out before the patterning process for forming a device isolation film after the boron implantation process for forming a P well and controlling the threshold voltage of the cell. The OED effect can be reduced by performing the RTP spark annealing process as the $N_2$ thermal treatment process for combining the oxide and the nitrogen in the gate oxide film, so that it is possible to obtain an uniform threshold voltage of the cell.

What is claimed is:

1. A method for forming a gate oxide film of a semiconductor device comprising the steps of;

forming a gate oxide film and a polysilicon film sequentially on a semiconductor substrate;

performing a nitrogen ion implantation process after the formation of the gate oxide film and the polysilicon film;

performing a thermal treatment process to form barrier layers by combination of oxides and nitrogen at an interface between the semiconductor substrate and the gate oxide film, and at an interface between the gate oxide film and the polysilicon film; and forming a nitride film on the polysilicon film.

2. The method of forming a gate oxide film of a semiconductor device according to claim 1, wherein the thermal treatment process is performed by an RTP spark annealing process.

3. The method of forming a gate oxide film of a semiconductor device according to claim 1, wherein the nitrogen ion implantation process is performed by using a source gas including $N^+$ or $N_2^+$, with a dose of 1E14 atoms/cm$^2$ to 1E16 atoms/cm$^2$ and an implantation energy of 1 keV to 20 keV.

4. The method of forming a gate oxide film of a semiconductor device according to claim 2, wherein the RTP spark annealing process is performed at an $N_2$ gas ambient, a ramp up temperature is about 100° C./sec, and the RTP temperature is 900° C. to 1100° C.

* * * * *